(12) United States Patent
Shiba

(10) Patent No.: US 6,553,047 B1
(45) Date of Patent: Apr. 22, 2003

(54) SEMICONDUCTOR LASER DEVICE WITH AN INSPECTION WINDOW, AND AN INSPECTION METHOD THEREFOR

(75) Inventor: Shigemitsu Shiba, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/536,644

(22) Filed: Mar. 28, 2000

(30) Foreign Application Priority Data

Apr. 28, 1999 (JP) ............................................. 11-122612

(51) Int. Cl.[7] ................................................. H01S 5/00
(52) U.S. Cl. .............................. 372/46; 372/44; 372/45; 372/46; 372/50; 372/103; 257/43; 257/97; 257/103; 257/225; 257/434; 257/435; 257/436
(58) Field of Search .............................. 372/46, 45, 44, 372/103, 50; 257/434, 435, 436, 225, 43, 97, 103

(56) References Cited

U.S. PATENT DOCUMENTS

| | | | | |
|---|---|---|---|---|
| 4,894,835 A | * | 1/1990 | Uomi et al. | 372/45 |
| 6,236,066 B1 | * | 5/2001 | Shiba | 257/99 |
| 6,291,258 B2 | * | 9/2001 | Kadota | 438/46 |

* cited by examiner

*Primary Examiner*—Paul Ip
*Assistant Examiner*—Delma R. Flores Ruiz
(74) *Attorney, Agent, or Firm*—Fitzpatrick, Cella, Harper & Scinto

(57) ABSTRACT

A semiconductor laser device having a chip electrode of a semiconductor laser is provided. The laser device includes a first electrode layer of a first material, and a second electrode layer of a second material. The second electrode layer has an opening corresponding to a light-emitting section of the laser, and is formed on a face of the first electrode layer. The first material of the first electrode layer is different than the second material of the second electrode layer.

13 Claims, 3 Drawing Sheets

SEMICONDUCTOR LASER DEVICE WITH AN INSPECTION WINDOW, AND AN INSPECTION METHOD THEREFOR

BACKGROUND OF THE INVENTION

1. Field of the Invention

The present invention relates to a semiconductor laser device for use in optical communication devices, optical information reading devices, and the like, and more particularly, to an electrode structure of a laser diode chip that facilitates the inspection process.

2. Description of the Related Art

FIG. 4 is a perspective view showing the configuration of a laser diode chip used in a conventional semiconductor laser device, and FIG. 5 is a cross-sectional view, taken along line B–B' of FIG. 4. Referring to FIGS. 4 and 5, the semiconductor laser device comprises an electrode 1 composed of layers made of different materials, a light-emitting section (oscillator) 2 inside a laser diode chip 3, the laser diode chip 3, anode and cathode surfaces 4 and 5 of the laser diode chip 3, a package stem or photodiode 6, a Au wire 7, and a light-emitting end face 8 from which laser light is emitted.

In the laser diode chip 3, one of the anode and cathode surfaces 4 and 5 is joined to the package stem or photodiode 6, and the electrode 1 is formed over almost the entirety of the other surface. The Au wire 7 is joined to the electrode 1 to establish electric contact with the outside.

In the laser diode chip 3 having such a configuration, a power supply is connected between the Au wire 7 and the package stem or photodiode 6, and current is passed through the laser diode chip 3, whereby laser oscillation occurs in the light-emitting section (oscillator) 2, and laser light is obtained from the light-emitting end face 8.

However, since the electrode 1 is formed on almost the entire anode or cathode surface 4 or 5 of the laser diode chip 3, as shown in FIGS. 4 and 5, it is impossible to observe the state of the light-emitting section (oscillator) 2 inside the laser diode chip 3 from the top side by using an optical microscope or an electronic microscope.

In the semiconductor laser device, it is well known that the crystal in the light-emitting section (oscillator) of the laser diode chip may break due to static electrical discharge from the outside, or due to electrical stress, such as surging, and that the crystal may become degraded and abnormal, with shortened service life, while decreasing light output over time as current is applied.

In a case in which the light-emitting section (oscillator) in the laser diode chip breaks or becomes abnormal, and light output decreases, it is effective for finding the cause of the decrease in light output to directly observe the light-emitting section (oscillator) inside the laser diode chip.

Conventionally, the state of the interior light-emitting section (oscillator) can be actually observed only after the electrode is entirely removed by a chemical agent to expose the anode or cathode surface of the laser diode chip, and an electrode is formed again in order to establish electric contact at such a position as not to hinder the observation of the light-emitting section (oscillator) inside the laser diode chip.

SUMMARY OF THE INVENTION

Accordingly, it is an object of the present invention to provide a semiconductor laser device having a chip electrode structure that facilitates observation of the interior of a laser diode chip.

In a first aspect of the present invention, a semiconductor laser device having a chip electrode of a semiconductor laser is provided. The laser device includes a first electrode layer of a first material, and a second electrode layer of a second material. The second electrode layer includes an opening corresponding to a light-emitting section of the laser. The second electrode layer is formed on a face of the first electrode layer and the first material of the first electrode layer is different than the second material of the second electrode layer.

In a second aspect of the present invention, a semiconductor laser device is provided. The laser device includes a laser diode chip having a light-emitting section. The laser device further includes a first electrode layer of a first material formed on a face of the laser diode chip. A second electrode layer of a second material is formed on a face of the first electrode layer and has an opening corresponding to the light-emitting section of the laser diode chip. The first material of the first electrode layer is different than the second material of the second electrode layer.

In another aspect of the present invention, a method for forming a viewable semiconductor device having a chip electrode of a semiconductor laser is provided. The method includes the step of providing a first electrode layer of a first material. The method also includes the step of providing a second electrode layer of a second material and having an opening corresponding to a light-emitting section of the laser. The second electrode layer is provided on a face of the first electrode layer and the first material of the first electrode layer is different than the second material of the second electrode layer.

In yet another aspect of the present invention, a method of forming a semiconductor laser device is provided. The method includes the step of providing a laser diode chip having a light emitting section. The method also includes the step of providing a first electrode layer of a first material formed on a face of the laser diode chip. A second electrode layer of a second material is provided, the second electrode layer being formed on a face of the first electrode layer and having an opening corresponding to the light-emitting section of the laser diode chip. The first material of the first electrode layer is different than the second material of the second electrode layer.

DESCRIPTION OF THE PREFERRED EMBODIMENTS

Figure 1:
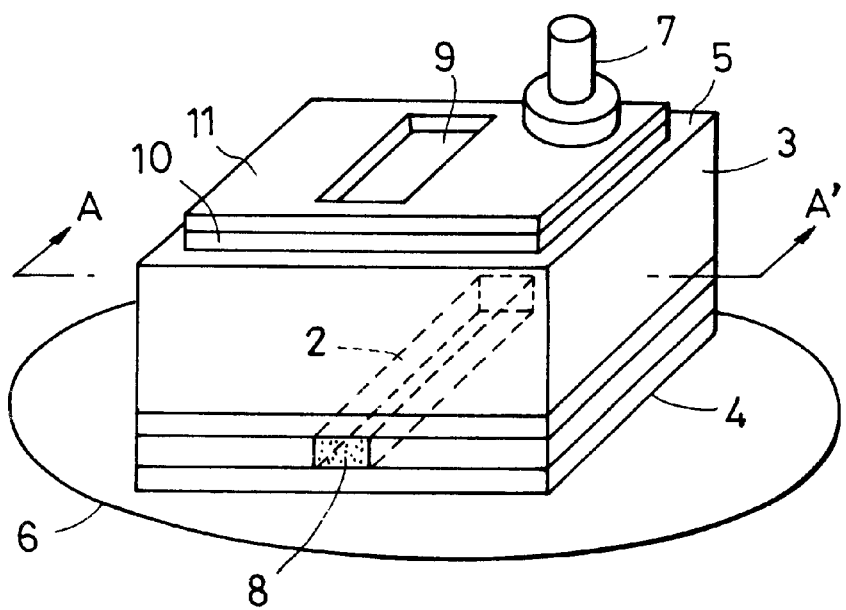
FIG. 1 is a perspective view of a semiconductor laser device according to a first embodiment of the present invention.

A semiconductor laser device according to a first embodiment of the present invention will be described below with reference to the attached drawings. FIG. 1 is a perspective view of a semiconductor laser device using an electrode structure of a laser diode chip according to the first embodiment, and FIG. 2 is a cross-sectional view showing the configuration of the semiconductor laser device, taken along line A–A' of FIG. 1.

Figure 2:
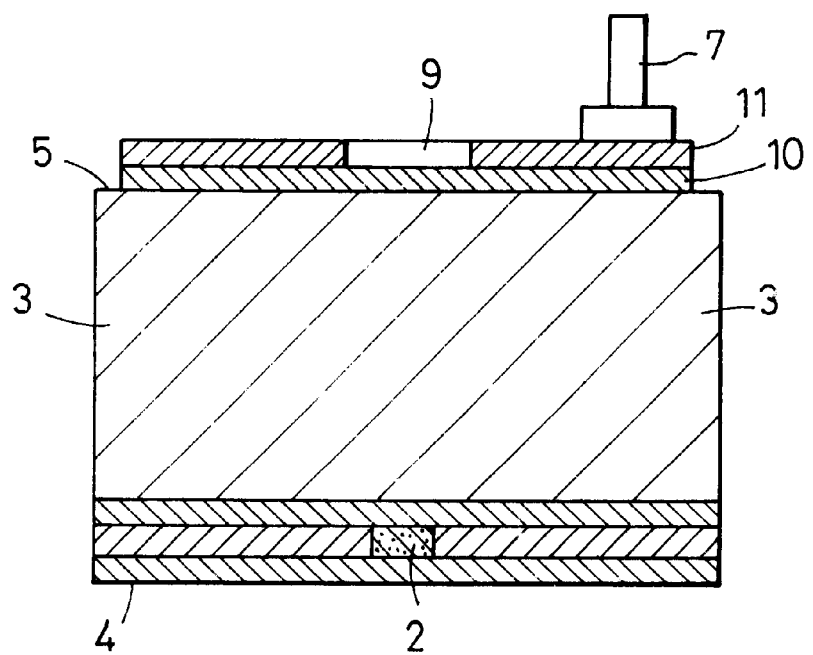
FIG. 2 is a cross-sectional view of the semiconductor laser device shown in FIG. 1.

In the semiconductor laser device of the first embodiment, first and second electrode layers 10 and 11 are formed on an anode surface or a cathode surface 4 or 5 of a laser diode chip 3, as shown in FIGS. 1 and 2. One of the surfaces is joined to a Au wire 7 to establish electrical contact with an outside power supply, and the other surface is joined to a package stem or photodiode 6 to pass electric current and to thereby yield laser light. Laser light is generated by an oscillator 2 inside the laser diode chip 3, and is emitted from a light-emitting end face 8 of the oscillator 2.

Figure 4:
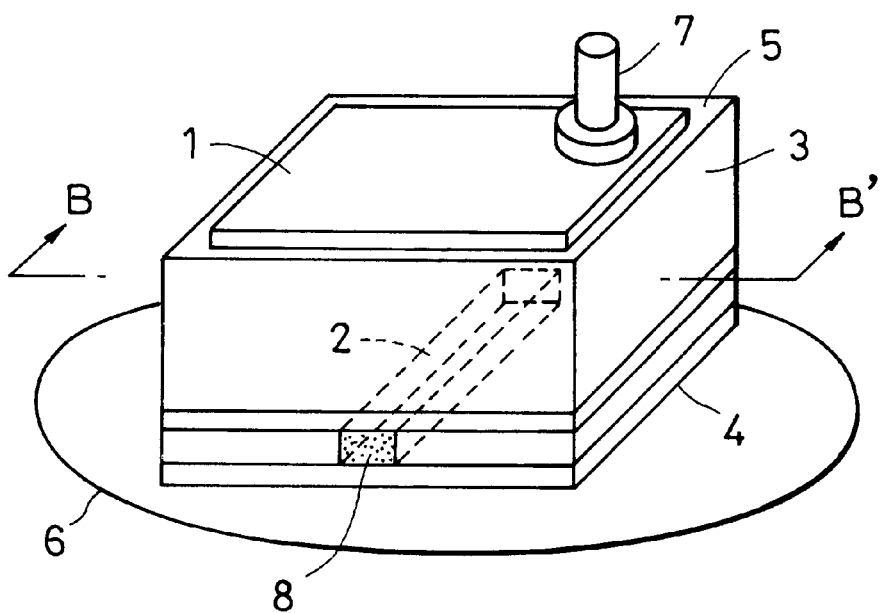
FIG. 4 is a perspective view of a conventional semiconductor laser device.
Figure 5:
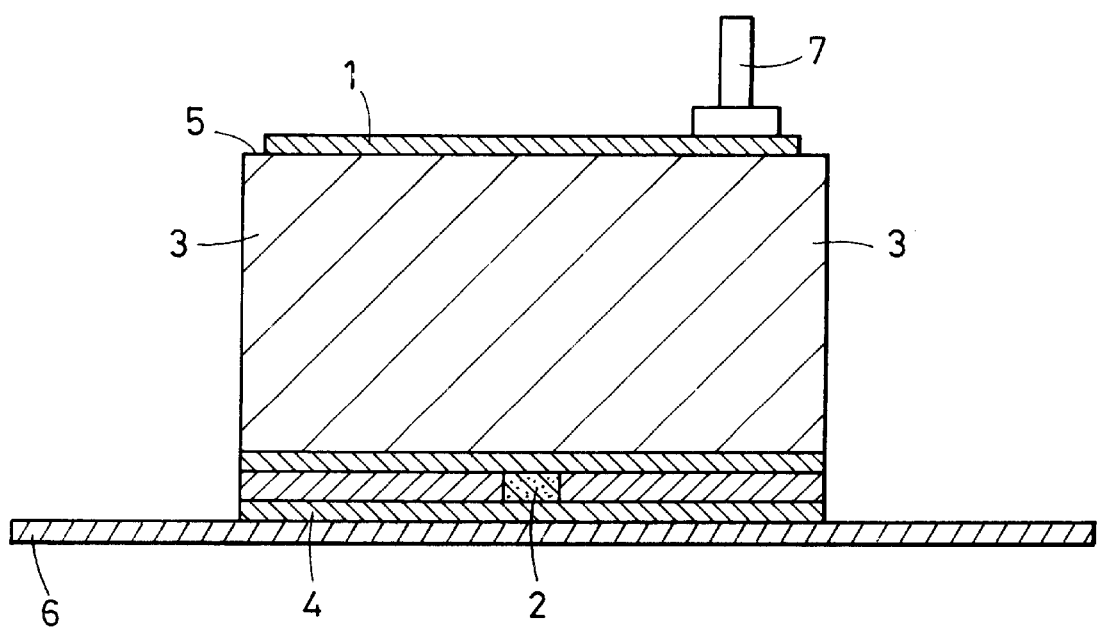
FIG. 5 is a cross-sectional view of the conventional semiconductor laser device shown in FIG. 4.

The electrode 1 of the conventional laser diode is formed of a conductive material all over one surface, as shown in FIGS. 4 and 5. This embodiment of the present invention adopts a two-layered structure, in which the first and second electrode layers 10 and 11 are made of conductive materials on the anode or cathode surface 4 or 5 of the laser diode chip 3, in order for the light-emitting section (oscillator) 2 to be observable. The first electrode layer 10 is made of Al, Al alloys, or the like, and does not have an opening. The second electrode layer 11 is made of Au, Ti, Ta, Cu, Mo, W, Sn, Ag, Pt, Ge, In, or alloys thereof, and has an opening 9 that conforms to the shape of the light-emitting section (oscillator) 2 inside the laser diode chip 3.

These electrode layers 10 and 11 are made of materials that are substantially different in chemical resistance so that selective etching is possible, and so that the etching rate of the electrode layer 10 having no opening is higher than that of the electrode layer 11 having the opening 9. Thereby, the configuration of the semiconductor laser device of the first embodiment is as shown in FIG. 1.

When inspecting such a semiconductor laser device of this embodiment, selective etching is performed by using, for example, phosphoric acid as an etchant. In this case, the upper electrode layer 11, made of Au or the like and having the opening 9, serves as a mask and allows a portion of the electrode layer 10 of Al or the like, which is exposed from the opening 9, to be selectively removed. The peripheral portions of the electrode layer 10 are not subjected to etching. For this reason, the peripheral electrode portions and the Au wire 7 maintain electrical contact, while the laser diode chip 3 is exposed along the light-emitting section (oscillator) 2 and can be observed from above.

Figure 3:
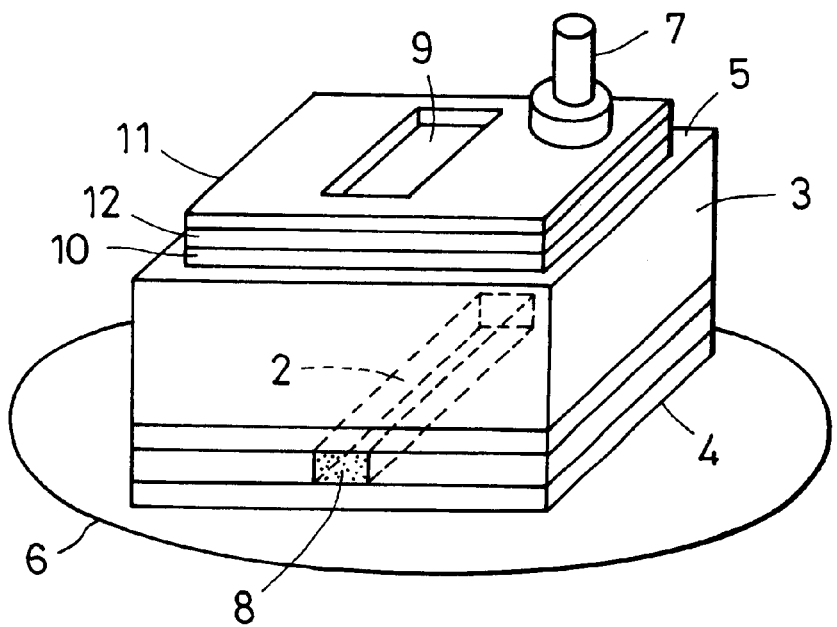
FIG. 3 is a perspective view of a semiconductor laser device according to a second embodiment of the present invention.

Next, description will be given of a semiconductor laser device according to a second embodiment of the present invention, in which the above-described electrode structure includes three or more electrode layers, as shown in FIG. 3. Referring to FIG. 3, an electrode layer 11 has an opening 9, and electrode layers 10 and 12 are formed under the electrode layer 11 and do not have an opening.

In this embodiment, the number of the electrode layers having an opening 9 and the number of the electrode layers having no opening 9 are not specified. Both types of electrode layers may be plural, or one type of electrode layer may be single and the other type of electrode layers may be plural. By combining the two types of electrode layers, plural electrode layers having an opening 9 and plural electrode layers having no opening 9, and by making both types of electrode layers of materials that are different in chemical resistance, the portion exposed from the opening 9 can be selectively etched.

As described above, according to this embodiment, the laser diode chip, which is the main part of the semiconductor laser device, has multiple electrode layers, one of the electrode layers has an opening, and the other electrode layers do not have openings. Therefore, the electrode can be formed on the entire laser diode chip surface in normal use. For this reason, operating current can be uniformly passed over the entire laser diode chip surface during operation. Moreover, since the electrode materials have differing characteristics, all the electrode layers are provided with an opening by selective etching, such as chemical etching. As a result, it is possible to more easily expose and observe the light-emitting section (oscillator) of the laser diode chip without subsequently having to form a new electrode, which is different from the procedure for a conventional device.

In a case in which the cause of abnormalities of the semiconductor laser device, such as a decrease in light output, lies in the interior of the laser diode chip, it is possible to easily and directly observe the laser diode chip light-emitting section (oscillator), and to effectively and precisely determine the cause of the abnormalities.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor laser device comprising:
   a laser diode chip;
   a first electrode layer of a first material not having an opening; and
   a second electrode layer of a second material having an opening corresponding to a light-emitting section of the laser diode chip, said second electrode layer being formed in contact with a face of said first electrode layer and the first material of said first electrode layer being different than the second material of said second electrode layer,
   wherein said first and second electrode layers connect said laser diode chip with a power source.

2. A semiconductor laser device as recited in claim 1, wherein an etching rate of the first electrode layer is higher than that of the second electrode layer.

3. A semiconductor laser device as recited in claim 1, wherein the first electrode layer includes an opening communicating with the opening of the second electrode layer.

4. A semiconductor laser device, comprising:
   a laser diode chip having a light emitting section;
   a first electrode layer of a first material formed on a face of said laser diode chip, said first electrode layer not having an opening; and
   a second electrode layer of a second material formed in contact with a face of said first electrod layer and having an opening corresponding to the light-emitting section of the laser diode chip the first material of said first electrode layer being different than the second material of said second electrode layer,
   wherein said first and second electrode layers connect said laser diode chip with a power source.

5. A semiconductor laser device as recited in claim 4, wherein an etching rate of the first electrode layer is higher than that of the second electrode layer.

6. A semiconductor laser device as recited in claim 4, wherein the first electrode layer includes an opening communicating with the opening of the second electrode layer.

7. A method for forming a viewable semiconductor device comprising the step of:

provic a laser diode chip;

providing a first electrode layer of a first material; and providing a second electrode layer of a second material having an opening corresponding to a light-emitting section of the laser diode chip, the second electrode layer being provided in contact with a face of the first electrode layer and the first material of the first electrode layer being different than the second material of the second electrode layer, wherein the first and second electrode layers are provided in a manner to provide an elecrical connection between the laser diode chip and a power source.

8. A method as recited in claim 7, further comprising the step of providing the first electrode layer with a surface facing the opening of the second electrode layer.

9. A method as recited in claim 7, further comprising the step of forming the first electrode layer from a material having a higher etching rate than that of the second electrode layer.

10. A method as recited in claim 7, further comprising the step of forming an opening through the first electrode layer communicating with the opening of the second electrode layer.

11. A method of forming a semiconductor laser device, comprising the steps of:

providing a laser diode chip having a light emitting section;

providing a first electrode layer of a first material formed on a face of the laser diode chip and not having an opening; and providing a second electrode layer of a second material formed in contact with a face of the first electrode layer and having an opening corresponding to the light-emitting section of the laser diode chip, the first material of the first electrode layer being different than the second material of the second electrode layer, wherein the first and second electrode layers are provided in a manner to provide an electrical connection between the laser diode chip and a power source.

12. A method as recited in claim 11, further comprising the step of forming the first electrode layer from a material having a higher etching rate than that of the second electrode layer.

13. A method as recited in claim 11, further comprising the step of forming an opening through the first electrode layer communicating with the opening of the second electrode layer.

* * * * *

UNITED STATES PATENT AND TRADEMARK OFFICE
CERTIFICATE OF CORRECTION

PATENT NO.    : 6,553,047 B1
DATED         : April 22, 2003
INVENTOR(S)   : Shigemitsu Shiba It is certified that error appears in the above-identified patent and that said Letters Patent is hereby corrected as shown below:

<u>Column 4,</u>
Line 52, "light emitting" should read -- light-emitting --.
Line 57, "electrod" should read -- electrode --; and
Line 59, "chip the" should read -- chip, the --.

<u>Column 5,</u>
Line 5, "step" should read -- steps --; and
Line 16, "elecrical" should read -- electrical --.

<u>Column 6,</u>
Line 3, "light emitting" should read -- light-emitting --.

Signed and Sealed this

Twenty-eighth Day of October, 2003

JAMES E. ROGAN
*Director of the United States Patent and Trademark Office*